US012805287B2

(12) United States Patent
Tsai

(10) Patent No.: US 12,805,287 B2
(45) Date of Patent: Nov. 17, 2026

(54) MEMORY DEVICE

(71) Applicant: MACRONIX INTERNATIONAL CO., LTD., Hsinchu (TW)

(72) Inventor: Ya-Chun Tsai, Hsinchu City (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 343 days.

(21) Appl. No.: 18/777,697

(22) Filed: Jul. 19, 2024

(65) Prior Publication Data

US 2024/0379562 A1 Nov. 14, 2024

Related U.S. Application Data

(63) Continuation of application No. 17/683,442, filed on Mar. 1, 2022, now Pat. No. 12,087,694.

(51) Int. Cl.

| | |
|---|---|
| ***H10W 20/20*** | (2026.01) |
| ***H10B 43/27*** | (2023.01) |
| ***H10B 43/40*** | (2023.01) |

(52) U.S. Cl.

CPC ............ *H10W 20/20* (2026.01); *H10B 43/27* (2023.02); *H10B 43/40* (2023.02)

(58) Field of Classification Search

CPC ........ H10W 20/20; H10B 43/40; H10B 43/27

See application file for complete search history.

(56) References Cited

U.S. PATENT DOCUMENTS

| | | | |
|---|---|---|---|
| 9,165,937 | B2 | 10/2015 | Yip et al. |
| 9,728,548 | B2 | 8/2017 | Freeman |
| 10,134,747 | B2 | 11/2018 | Lee |
| 10,950,623 | B2 | 3/2021 | Song |
| 11,024,636 | B1 | 6/2021 | Leobandung |
| 11,282,827 | B2 | 3/2022 | Yun |
| 2013/0335312 | A1 | 12/2013 | Sasagawa |
| 2014/0217490 | A1 | 8/2014 | Seo et al. |
| 2019/0103467 | A1 | 4/2019 | Takaki et al. |
| 2020/0098779 | A1 | 3/2020 | Cernea et al. |

(Continued)

FOREIGN PATENT DOCUMENTS

| | | | |
|---|---|---|---|
| TW | 201232548 | A | 8/2012 |
| TW | 201405166 | A | 2/2014 |

(Continued)

*Primary Examiner* — Trang Q Tran

(74) *Attorney, Agent, or Firm* — McClure, Qualey & Rodack, LLP

(57) ABSTRACT

A memory device includes a stacked structure including conductive layers and first insulating layers alternately stacked along a first direction; a first array region; a second array region; and a connection region disposed between the first array region and the second array region, and including a staircase region, an unprocessed region, a top isolating member and a common wall, wherein the unprocessed region extends along the first direction, the staircase region is adjacent to a first side of the unprocessed region, the common wall is adjacent to a second side of the unprocessed region. A portion of the conductive layers continuously extends in the staircase region, the first array region, the common wall and the second array region. The top isolating member extends along the first direction to separate the conductive layers disposed in a top portion of the stacked structure.

11 Claims, 10 Drawing Sheets

(56) References Cited

U.S. PATENT DOCUMENTS

| | | | | |
|---|---|---|---|---|
| 2020/0168547 | A1* | 5/2020 | Lim ....................... | H10B 43/10 |
| 2021/0043541 | A1 | 2/2021 | Eid et al. | |
| 2021/0043573 | A1 | 2/2021 | Eid et al. | |
| 2024/0121959 | A1 | 4/2024 | Tokita | |

FOREIGN PATENT DOCUMENTS

| | | | |
|---|---|---|---|
| TW | 202025445 | A | 7/2020 |
| TW | 202032767 | A | 9/2020 |
| TW | 202141737 | A | 11/2021 |
| TW | 202205536 | A | 2/2022 |

* cited by examiner

MEMORY DEVICE

This is a Continuation of U.S. application Ser. No. 17/683,442, filed Mar. 1, 2022, the subject matter of which is incorporated herein by reference.

BACKGROUND OF THE INVENTION

Field of the Invention

The invention relates in general to a memory device, and more particularly to a three-dimensional memory device.

Description of the Related Art

Recently, people's demand for memory devices continues to increase. With more and more applications nowadays, how to provide memory devices with higher storage capacity has become one of important ways for study. Therefore, the development of three-dimensional memory devices is becoming more and more urgent.

SUMMARY OF THE INVENTION

The present invention relates to a memory device, and more particularly to a three-dimensional memory device. The three-dimensional memory device of the present application can provide a memory device with a high storage capacity, and compared to the comparative example in which a staircase region is provided on a single side of the memory array region, the memory device of the present application can have an improved operating speed.

According to an embodiment of the present invention, a memory device is provided. The memory device includes a stacked structure, a circuit structure, and a vertical contact. The stacked structure includes a plurality of conductive layers and a plurality of first insulating layers alternately stacked along a first direction, a first array region, a second array region, and a connection region. The first array region includes a plurality of first channel pillars extending along the first direction. The second array region includes a plurality of second channel pillars extending along the first direction. The connection region is disposed between the first array region and the second array region. The connection region includes a staircase region, an unprocessed region, a bottom isolating member and a common wall. The unprocessed region extends along the first direction and has an isolating sidewall. The isolating sidewall electrically isolates the conductive layers from the unprocessed region. The staircase region is adjacent to a first side of the unprocessed region, and the common wall is adjacent to a second side of the unprocessed region. The first side is opposite to the second side, and a portion of the conductive layers continuously extends in the staircase region, the first array region, the common wall, and the second array region. The bottom isolating member extends along the first direction to separate the conductive layers disposed in a bottom portion of the stacked structure and defines ground selection lines, and the bottom isolating member contacts the isolating sidewall. The circuit structure is disposed under the connection region. The vertical contact passes through the unprocessed region and electrically connects the circuit structure to the corresponding conductive layer.

According to a further embodiment of the present invention, a memory device is provided. The memory device includes a stacked structure, a circuit structure, and a vertical contact. The stacked structure includes a plurality of conductive layers and a plurality of first insulating layers alternately stacked along a first direction, a first array region, a second array region, a connection region, a plurality of trenches and a plurality of top isolating members. The first array region includes a plurality of first channel pillars extending along the first direction. The second array region includes a plurality of second channel pillars extending along the first direction. The connection region is disposed between the first array region and the second array region. The connection region includes a staircase region, an unprocessed region, a bottom isolating member and a common wall. The trenches extend and pass through the stacked structure along the first direction, and extend along a second direction perpendicular to the first direction, wherein the trenches include a first trench, a second trench, a third trench, a fourth trench and a fifth trench, the second trench is disposed between the first trench and the third trench, and the fourth trench is disposed between the third trench and the fifth trench. The top isolating members extend along the first direction and pass through the corresponding conductive layer disposed in a top portion of the stacked structure. The first trench, the third trench, and the fifth trench continuously extend along the second direction, respectively, to divide the stacked structure into a first block and a second block. The second trench and the top isolating members on opposite sides of the second trench separate the first block into 4 sub-blocks. The fourth trench and the top isolating members on opposite sides of the fourth trench separate the second block into 4 sub-blocks. In each of the first block and the second block, the staircase region is adjacent to a first side of the unprocessed region, the common wall is adjacent to a second side of the unprocessed region, the first side is opposite to the second side, and a portion of the conductive layers continuously extends in the staircase region, the first array region, the common wall, and the second array region. The unprocessed region extends along the first direction and has an isolating sidewall. The isolating sidewall electrically isolates the conductive layers from the unprocessed region. The bottom isolating member extends along the first direction to separate the conductive layers disposed in a bottom portion of the stacked structure and defines ground selection lines, and the bottom isolating member contacts the isolating sidewall. The circuit structure is disposed under the connection region. The vertical contact passes through the unprocessed region and electrically connects the circuit structure to the corresponding conductive layer.

The above and other aspects of the invention will become better understood with regard to the following detailed description of the preferred but non-limiting embodiment(s). The following description is made with reference to the accompanying drawings.

BRIEF DESCRIPTION OF THE DRAWINGS

FIG. 4 shows a cross-sectional view taken along the line X1-X1' in

FIG. 2.

DETAILED DESCRIPTION OF THE INVENTION

In the following detailed description, for ease of explanation, various specific details are provided to understand the embodiments of the present disclosure as a whole. However, it should be understood that one or more embodiments can be implemented without employing these specific details. In other cases, in order to simplify the drawings, the known structures and components are shown in schematic diagrams.

The singular forms "one" and "the" used in the specification and the appended claims of the present application include plural expressions, unless there are clear instructions in the context. For example, the expression "a vertical contact" includes a plurality of such vertical contacts.

The memory device of the present application can be applied to 3D NAND memory, 3D NOR memory, 3D AND memory, or other suitable memory.

Figure 1:
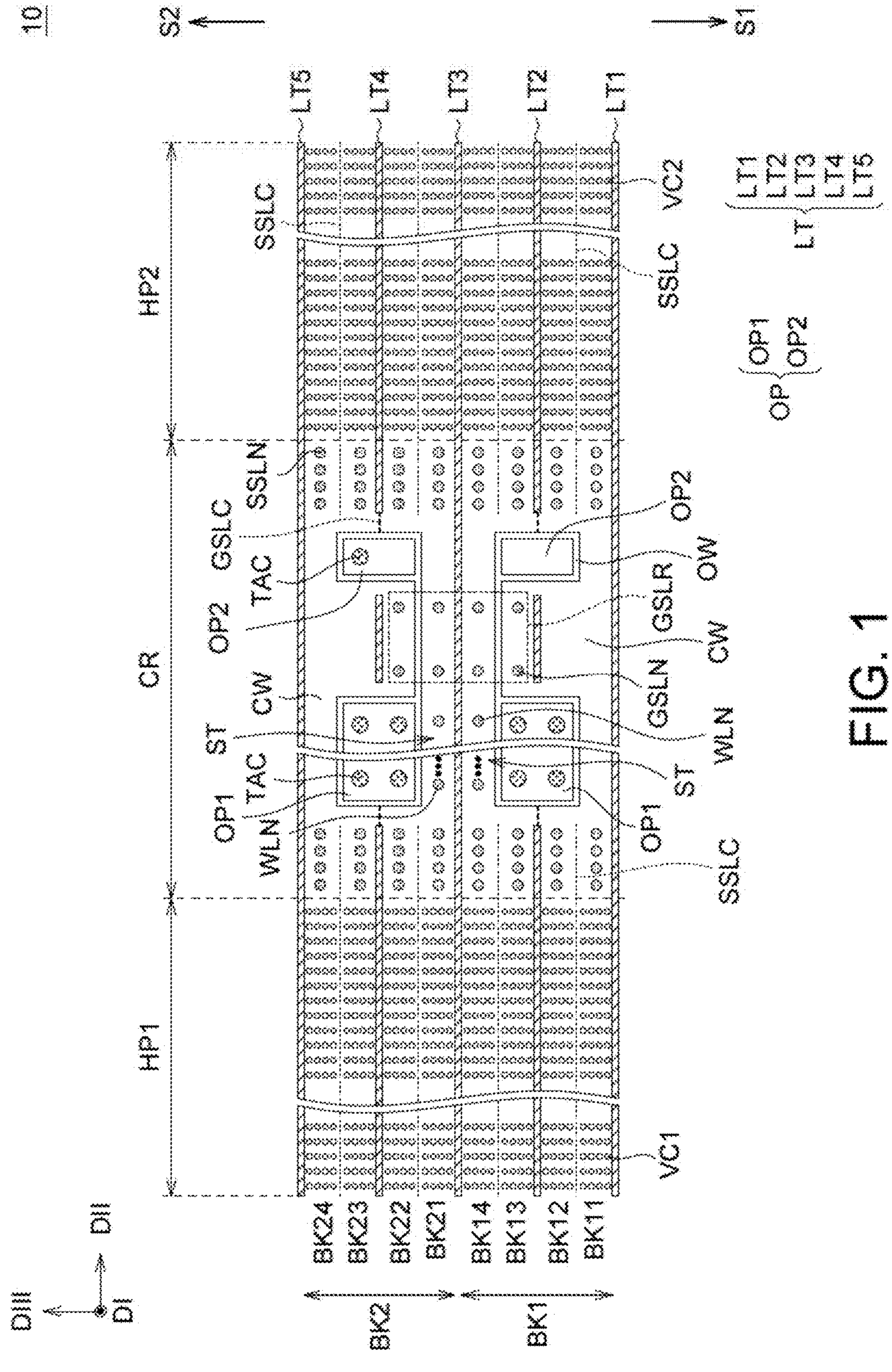
FIG. 1 shows a top view illustrating a memory device according to an embodiment of the present invention.
Figure 2:
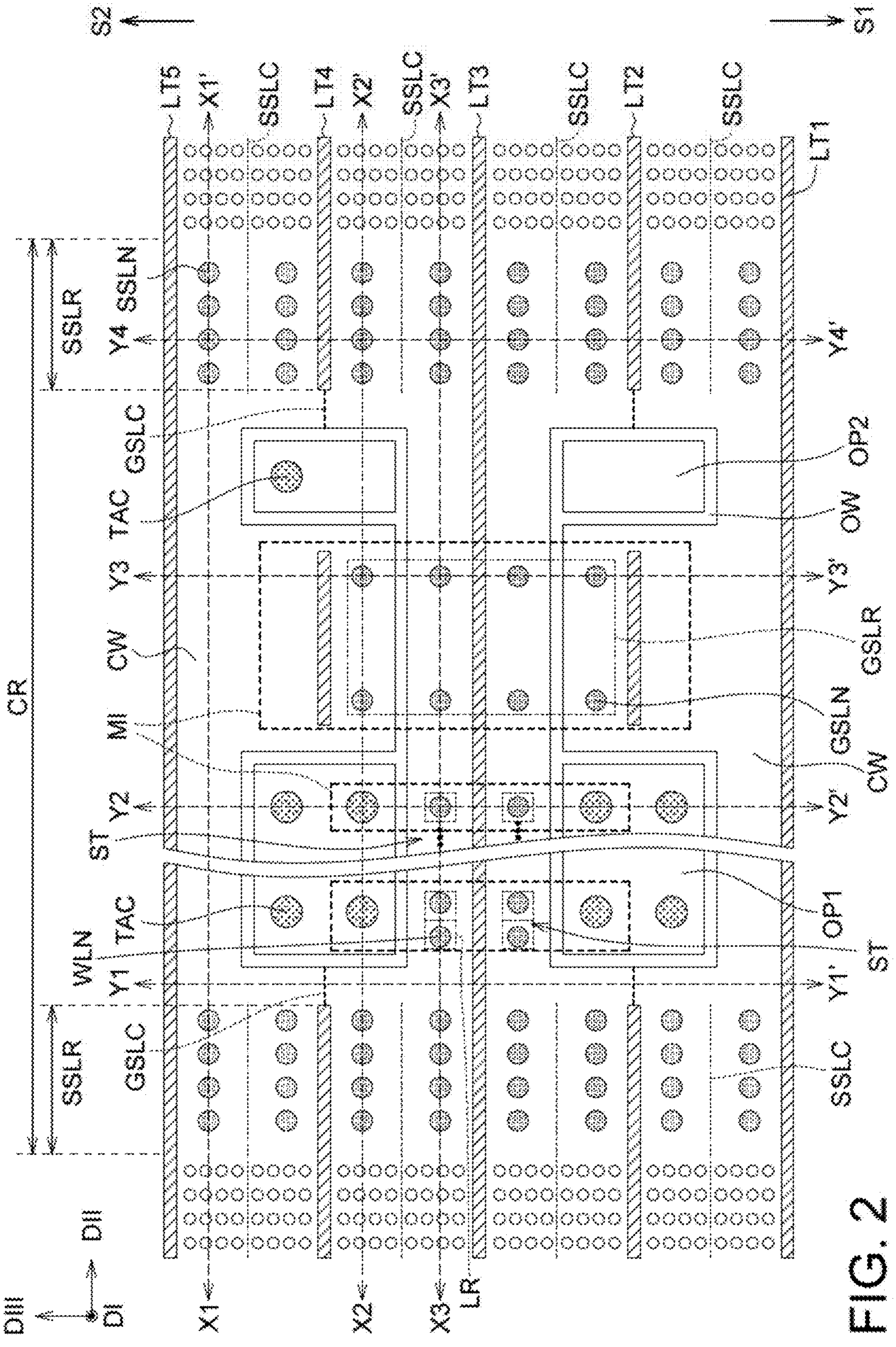
FIG. 2 shows a partial enlarged view of FIG. 1.
Figure 3:
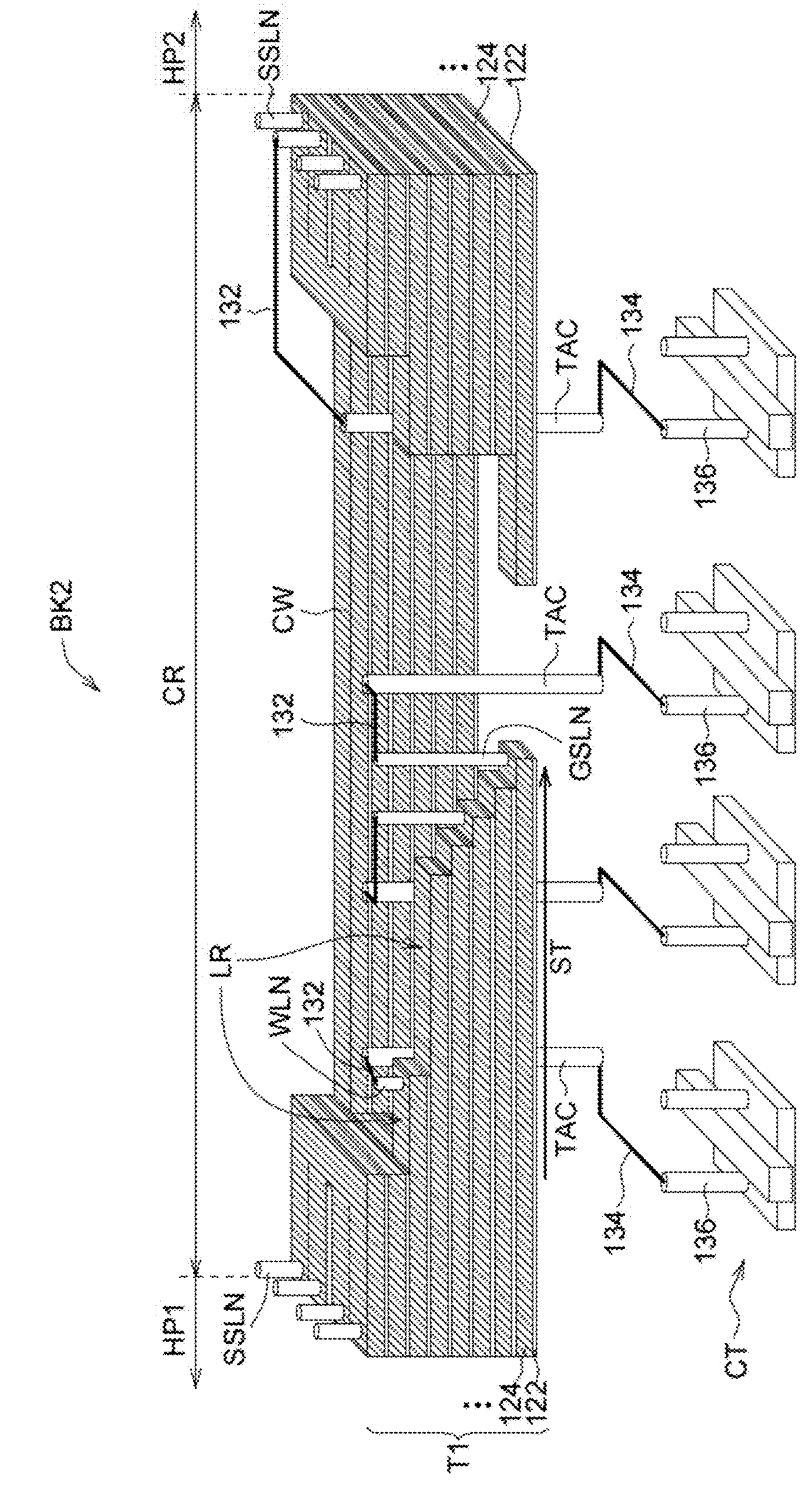
FIG. 3 shows a partial perspective view illustrating a memory device according to an embodiment of the present invention.
Figure 4:
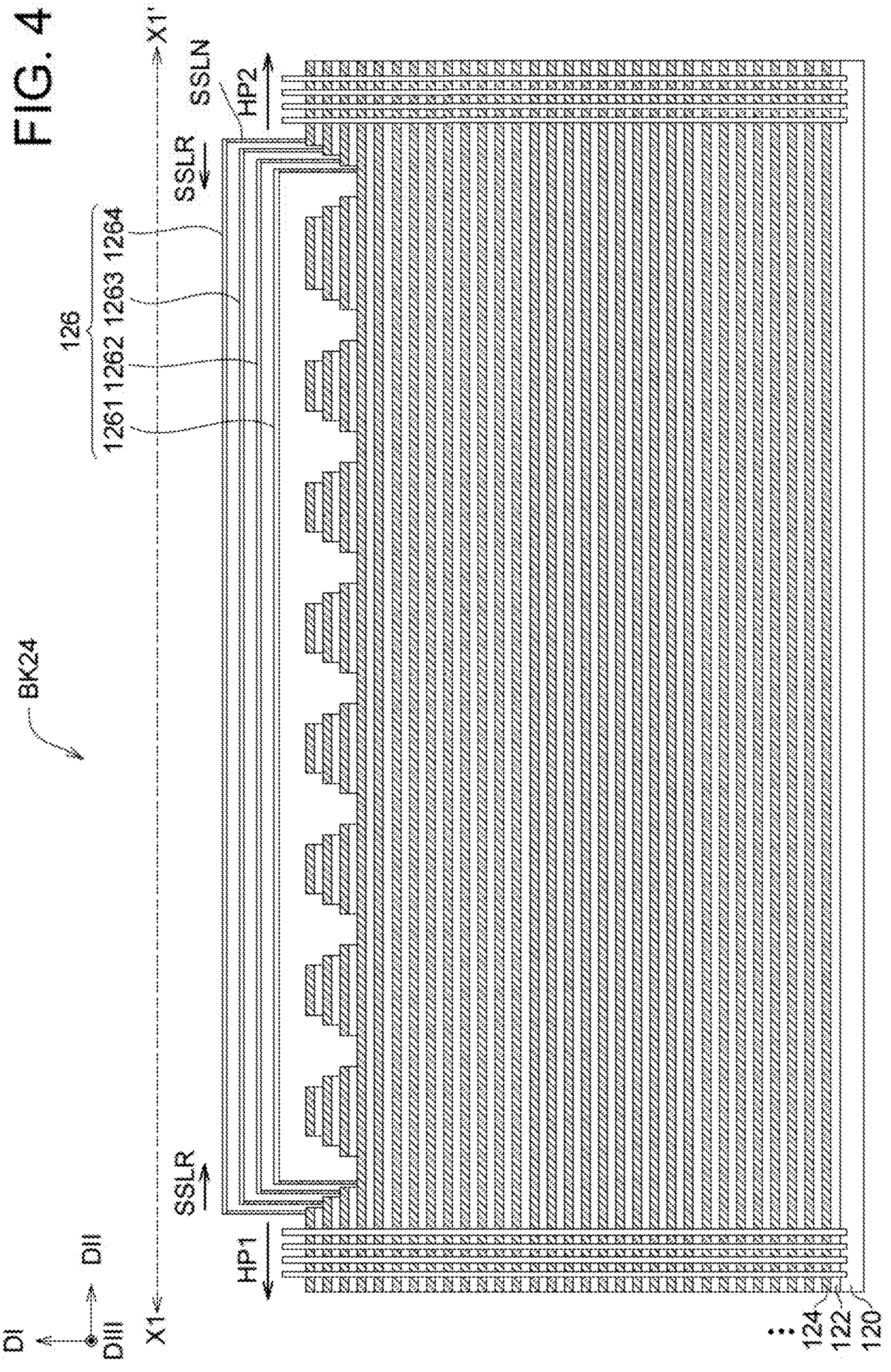
Figure 5:
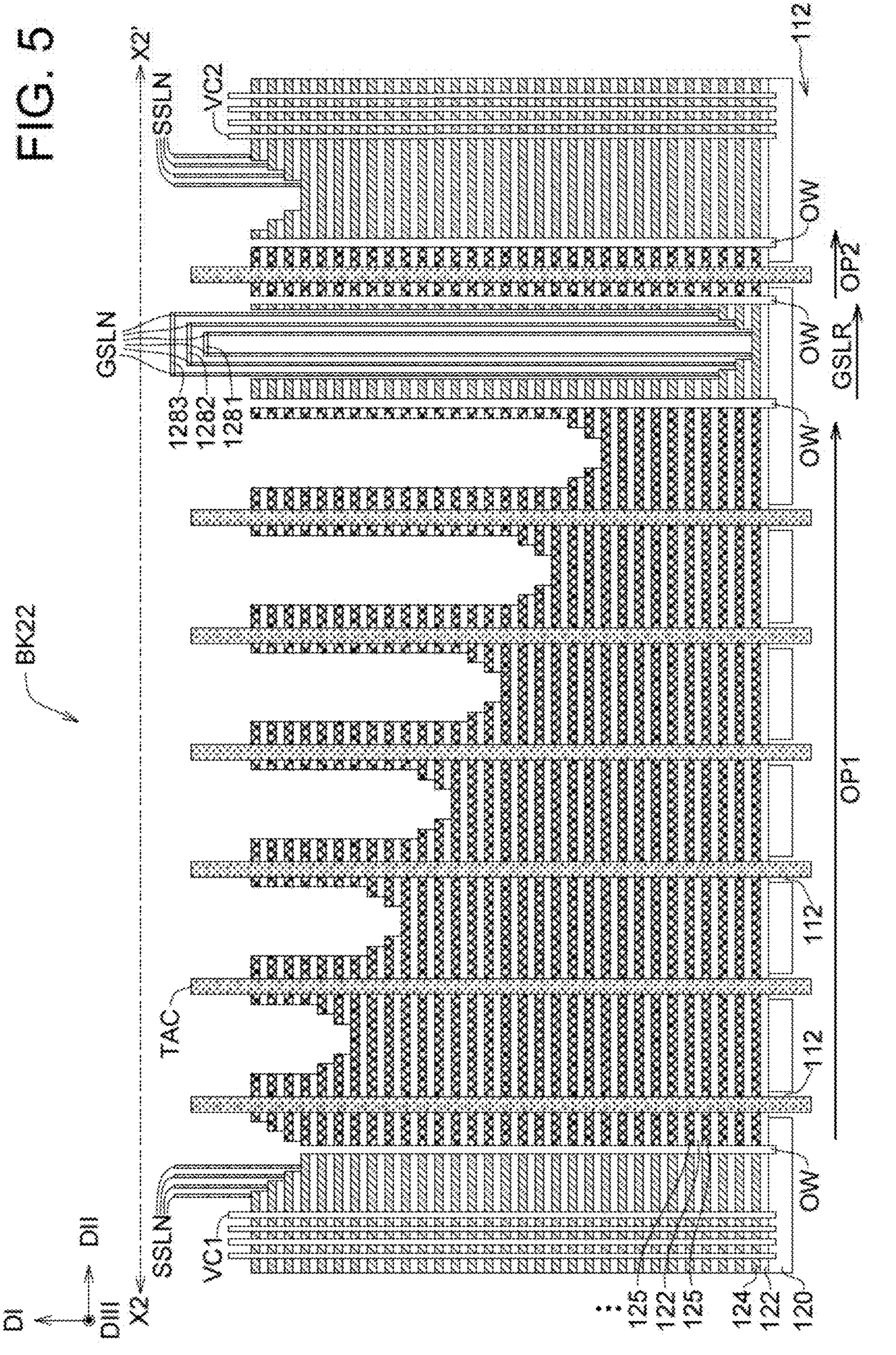
FIG. 5 shows a cross-sectional view taken along the line X2-X2' in FIG. 2.
Figure 6:
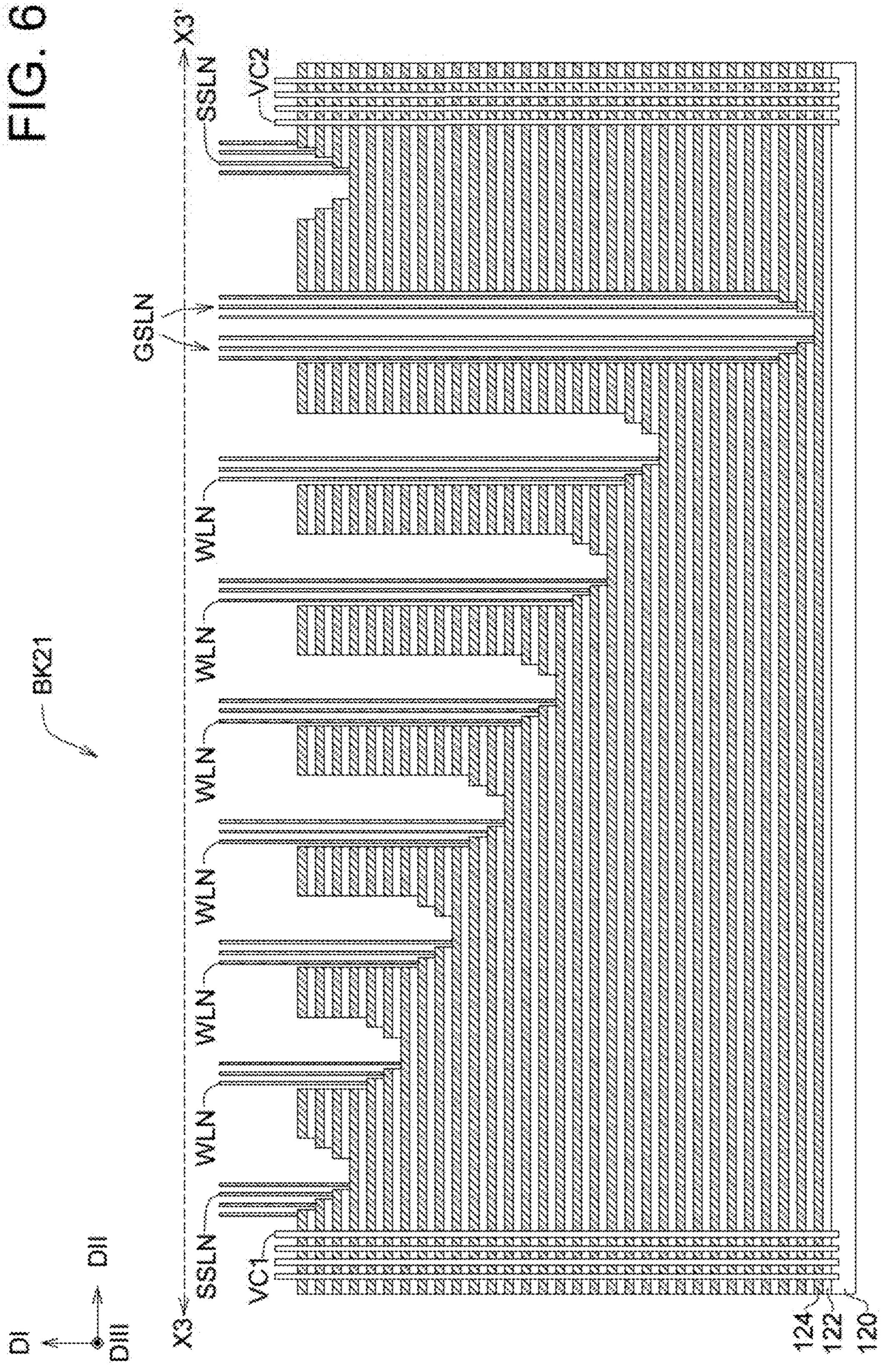
FIG. 6 shows a cross-sectional view taken along the line X3-X3' in FIG. 2.
Figure 7:
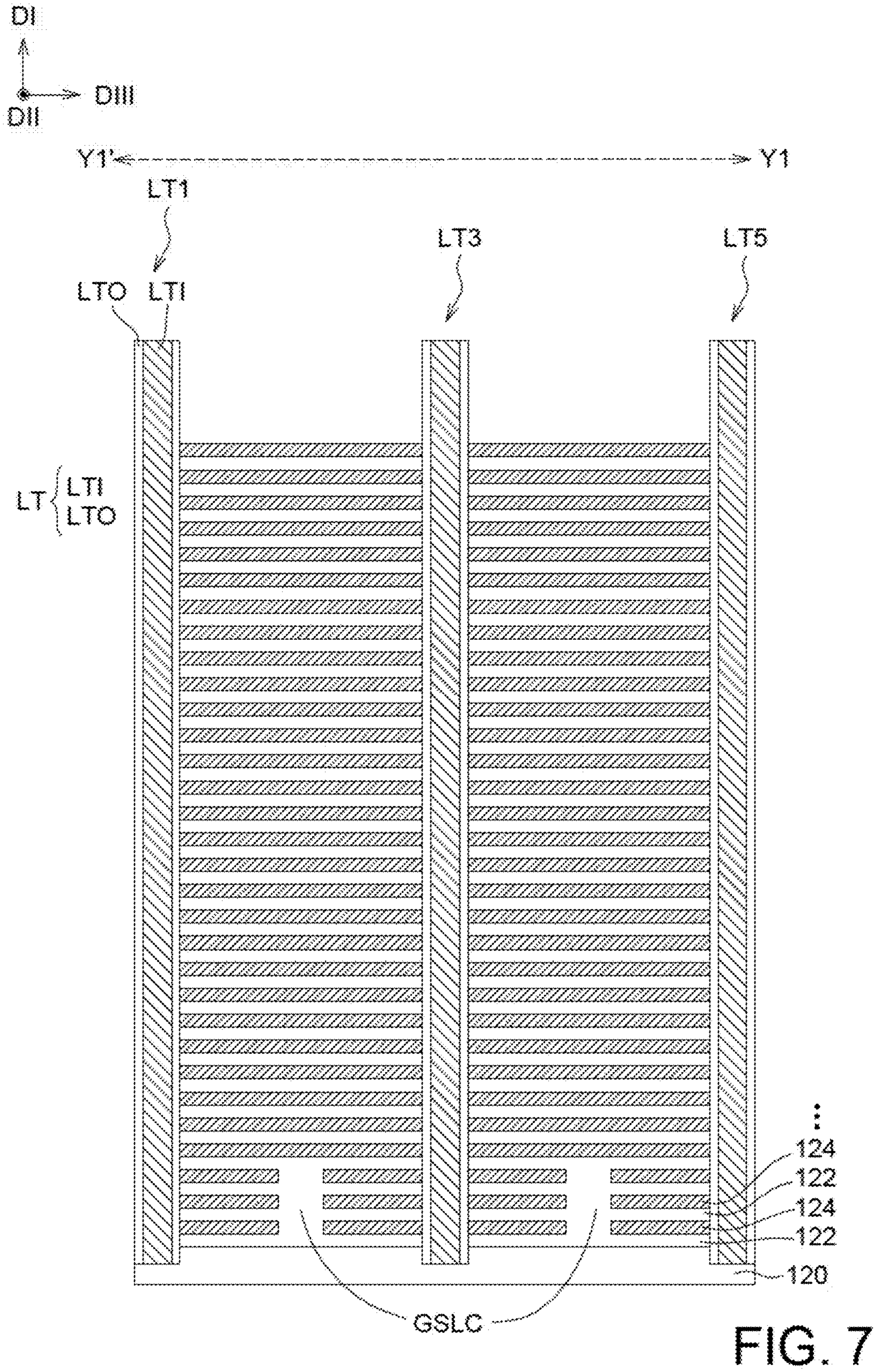
FIG. 7 shows a cross-sectional view taken along the line Y1-Y1' in FIG. 2.
Figure 8:
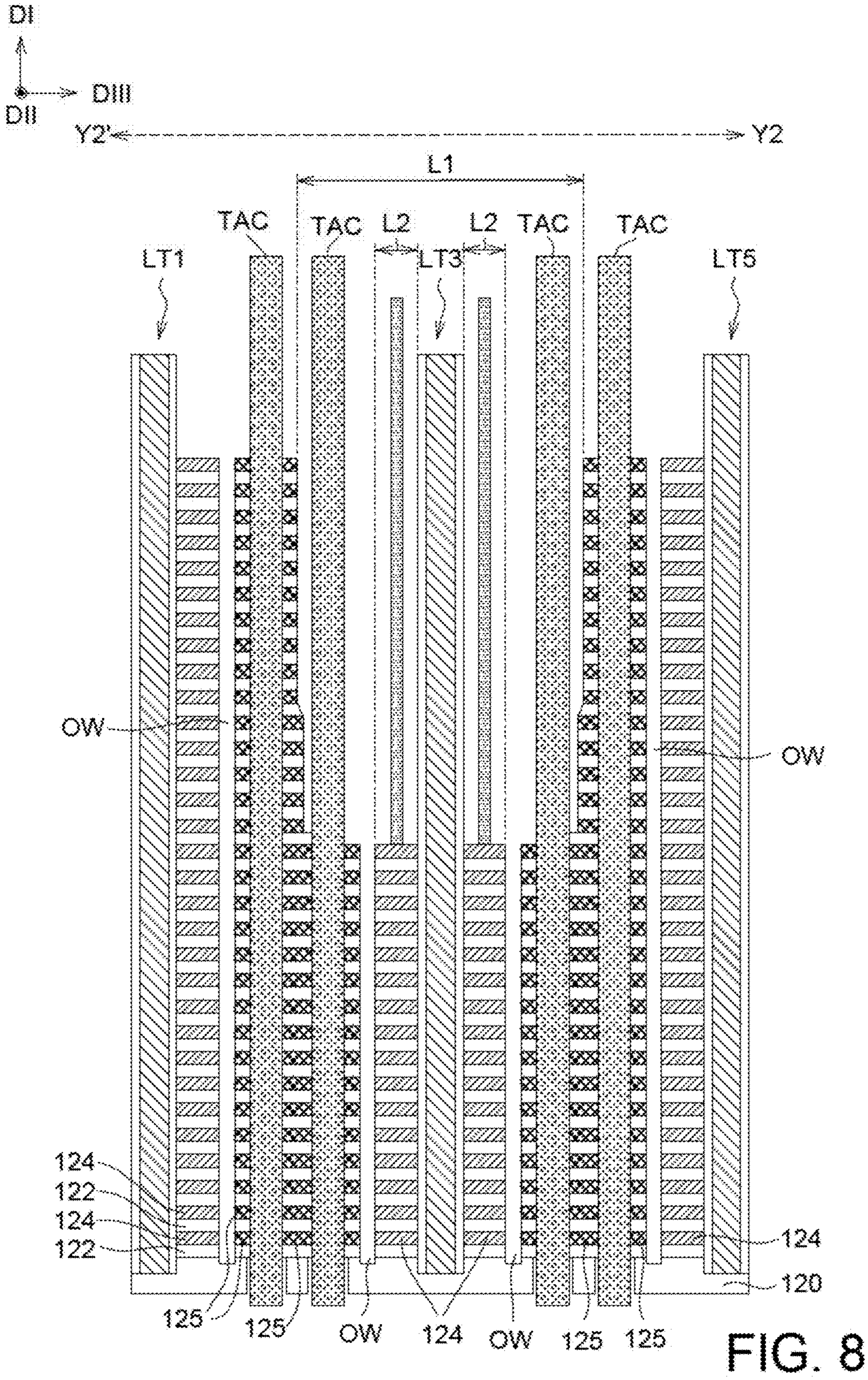
FIG. 8 shows a cross-sectional view taken along the line Y2-Y2' in FIG. 2.
Figure 9:
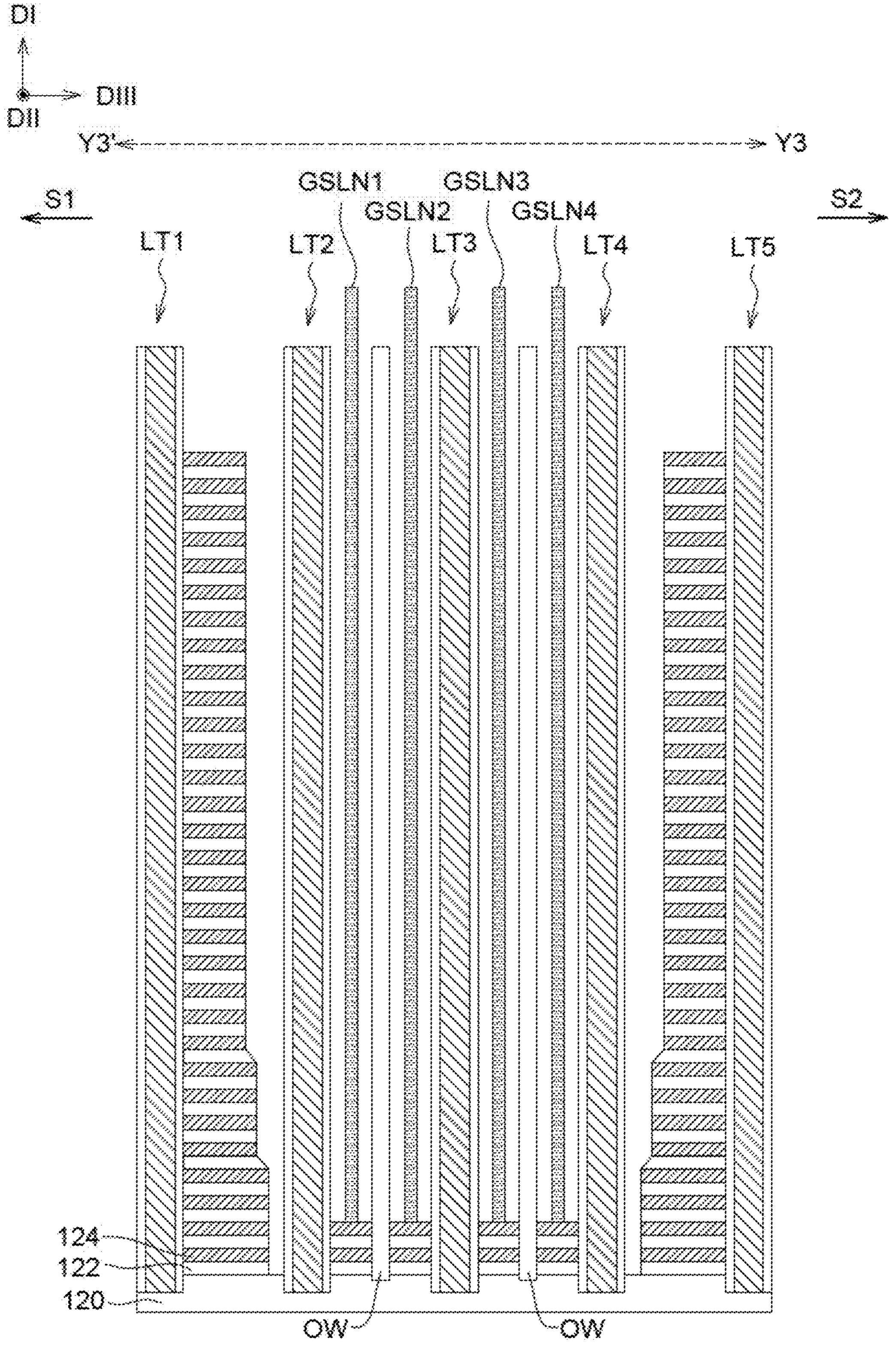
FIG. 9 shows a cross-sectional view taken along the line Y3-Y3' in FIG. 2.
Figure 10:
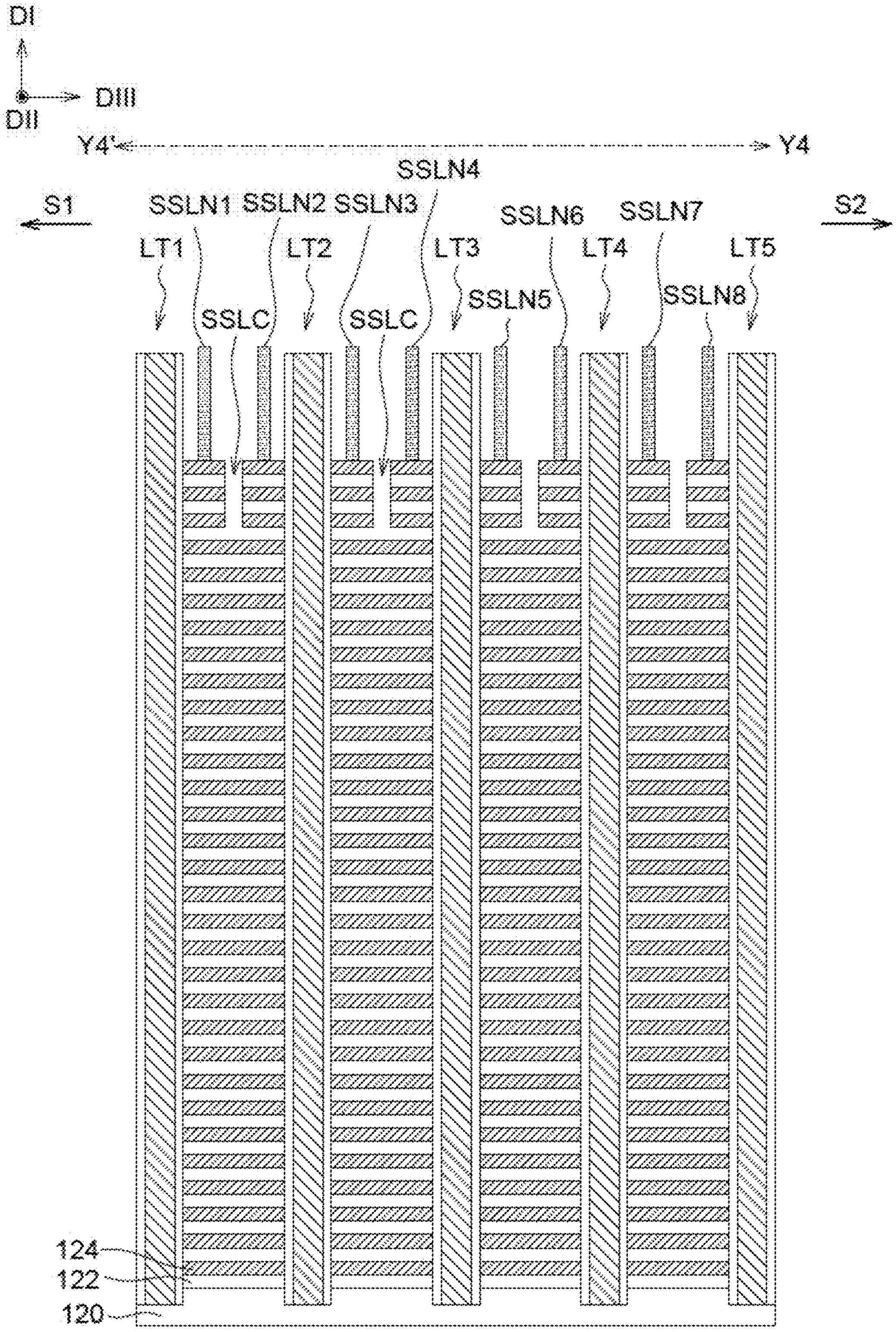
FIG. 10 shows a cross-sectional view taken along the line Y4-Y4' in FIG. 2.

FIG. 1 shows a top view illustrating a memory device 10 according to an embodiment of the invention. FIG. 2 shows a partial enlarged view of FIG. 1, particular for the more detailed description of a connection region CR. For example, FIGS. 1-2 correspond to a plane formed by a second direction DII and a third direction DIII. FIG. 3 shows a partial perspective view illustrating a memory device 10 according to an embodiment of the present invention. FIG. 4 shows a cross-sectional view taken along the line X1-X1' in FIG. 2. FIG. 5 shows a cross-sectional view taken along the line X2-X2' in FIG. 2. FIG. 6 shows a cross-sectional view taken along the line X3-X3' in FIG. 2. For example, FIGS. 4-6 correspond to a plane formed by a first direction DI and a second direction DII, respectively. FIG. 7 shows a cross-sectional view taken along the line Y1-Y1' in FIG. 2. FIG. 8 shows a cross-sectional view taken along the line Y2-Y2' in FIG. 2. FIG. 9 shows a cross-sectional view taken along the line Y3-Y3' in FIG. 2. FIG. 10 shows a cross-sectional view taken along the line Y4-Y4' in FIG. 2. For example, FIGS. 7-10 correspond to a plane formed by a first direction DI and a second direction DII, respectively. In the present embodiment, the first direction DI, the second direction DII and the third direction DIII are perpendicular to each other, but the present invention is not limited thereto, as long as the first direction DI, the second direction DII and the third direction DIII are intersected to each other.

Referring to FIGS. 1 to 3 at the same time, the memory device 10 includes a stacked structure T1, a plurality of circuit structures CT, and a plurality of vertical contacts TAC (as illustrated in FIG. 3). The stacked structure T1 includes a bottom plate 120 (shown in FIG. 4) and a plurality of conductive layers 124 and a plurality of first insulating layers 122 alternately stacked on an upper surface of the bottom plate 120 (shown in FIG. 4) along a first direction DI. Moreover, as seen from the top views of FIGS. 1 and 2, the stacked structure T1 includes a first array region HP1, a second array region HP2, and a connection region CR. The first array region HP1 includes a plurality of first channel pillars VC1 extending along the first direction DI. The second array region HP2 includes a plurality of second channel pillars VC2 extending along the first direction DI. In at least one embodiment, the first array region HP1 and the second array region HP2 are a first memory array and a second memory array including a plurality of memory strings, respectively. The connection region CR is disposed between the first array region HP1 and the second array region HP2. The conductive layers 124 disposed in a bottom portion of the stacked structure T1 (i.e. acting as ground selection lines), the conductive layers 124 disposed in a middle portion of the stacked structure T1 (i.e. acting as word lines), and the conductive layers 124 disposed in a top portion of the stacked structure T1 (i.e. acting as string selection lines) are sequentially stacked on the bottom plate 120 (shown in FIG. 4). Compared with the comparative example in which the connection region in one block is only disposed on a single side of the array region, since the connection region CR of this embodiment is disposed between the first array region HP1 and the second array region HP2, the distance of the transmission path in current/voltage between the circuit structure CT and the first array region HP1 or between the circuit structure CT and the second array region HP2 can be shortened, so the resistance and capacitance can be reduced, thereby increasing the operating speed of the memory device 10.

In one example, the (first or second) channel pillar VC1 or VC2 can include multiple layers that can include a tunneling layer, a charge trapping layer, and a blocking layer. The tunneling layer can include a silicon oxide, or a silicon oxide/silicon nitride combination (e.g. Oxide/Nitride/Oxide or ONO). The charge trapping layer can include silicon nitride (SiN) or other materials capable of trapping charges. The blocking layer can include silicon oxide, aluminum oxide, and/or combinations of such materials. The multiple layers can be formed on an internal surface of a hole penetrates downwards through multiple alternating pairs of conductive layers 124 (gate layer or word line layer) and first insulating layers 122, and polysilicon can be filled in a middle of the hole. The filled materials (e.g., the multiple layers and polysilicon) in each the (first or second) channel pillar intersecting the conductive layers 124 can form a string of memory cells along the first direction DI. Each channel pillar (VC1 or VC2) includes the string of memory cells in series connected in NAND type.

As shown in FIG. 1, the memory device 10 further includes a plurality of trenches LT and a plurality of top isolating members SSLC. In the present embodiment, the trenches LT extend and pass through the stacked structure T1 along the first direction DI, and extend along the second direction DII, and include the first trench LT1 to the fifth trench LT5. Each trench (LT1 to LT5) has a side surface (or wall) covered with a dielectric film (e.g., oxide) isolated from adjacent layers (e.g., conductive layers 124) and an inner part filled with a conductive material (e.g., tungsten). The first trench LT1 to the fifth trench LT5 are sequentially disposed along the third direction DIII and separated from each other. That is, the second trench LT2 is disposed between the first trench LT1 and the third trench LT3, and the fourth trench LT4 is disposed between the third trench LT3 and the fifth trench LT5, the number of trenches in the present invention is not limited thereto.

As shown in FIGS. 2 and 10, the top isolating members SSLC extend along the first direction DI and pass through the corresponding conductive layers 124 disposed in the top portion of the stacked structure T1, and continuously extend from the first array region HP1 to an edge portion of the connection region CR adjacent to the first array region HP1 along the second direction DII. The top isolating members SSLC continuously extend from "an edge portion of the connection region CR adjacent to the second array region HP2" to the second array region HP2 along the second direction DII, to define the string selection lines. Each top isolating member SSLC includes an insulating material (e.g., oxide) to isolate the conductive layers 124 on opposite side of each top isolating member SSLC disposed in the top portion of the stacked structure T1. The above-mentioned edge portions are also referred to top landing regions SSLR (as shown in FIG. 2). The first trench LT1, the third trench LT3, and the fifth trench LT5 respectively extend continuously along the second direction DII, dividing the stacked structure T1 into two blocks BK1 and BK2. The second trench LT2 and the fourth trench LT4 discontinuously extend along the second direction DII, respectively. The second trench LT2 and the top isolating members SSLC on opposite side of the second trench LT2 separate the blocks BK1 into 4 sub-blocks BK11 to BK14. Similarly, the fourth trench LT4 and the top isolating members SSLC on opposite side of the fourth trench LT4 separate the blocks BK2 into 4 sub-blocks BK21 to BK24, respectively. Blocks BK1 and BK2 can be independently controlled and operated.

As shown in FIG. 2, the connection region CR includes a plurality of staircase regions ST, a plurality of stepped structures MI, a plurality of unprocessed regions OP (OP1 and OP2), a plurality of bottom isolating members GSLC, and a plurality of common walls CW. Each stepped structure MI extends along the third direction DIII from the blocks BK1 to the blocks BK2. The staircase regions ST in the block BK1 and the block BK2 overlap the corresponding stepped structures MI in the top view.

In each block (BK1 or BK2), each unprocessed regions (OP1 or OP2) extends along the first direction DI and has an isolating sidewall OW. The isolating sidewall OW surrounds the unprocessed region OP (OP1 and OP2) and electrically isolates the conductive layers 124 from the unprocessed region OP (OP1 and OP2). In each block (BK1 or BK2), the first unprocessed region OP1 and the second unprocessed region OP2 are connected by a side of the isolating sidewall OW. The side of the isolating sidewall OW is adjacent to the staircase regions ST and extends along the second direction DII. The isolating sidewall OW extends and penetrates through the stacked structure T1 along the first direction DI. The isolating sidewall OW is configured to prevent a removal of the second insulating layers 125 in the unprocessed regions OP (OP1 and OP2) during the gate replacement process of the memory device 10 fabrication. That is, the gate replacement process is not performed in the unprocessed regions OP (OP1 and OP2). The unprocessed regions OP (OP1 and OP2) include a stack of alternating pairs of first insulating layer 122 (e.g., oxide) and second insulating layer 125 (e.g., nitride) as shown in FIG. 5. As shown in FIG. 5, the stack of alternating pairs of first insulating layer 122 and second insulating layer 125 in the unprocessed regions OP (OP1 and OP2) is electrically isolated from the conductive layers 124.

Back to FIG. 2, in the block BK2, the staircase regions ST are between the first unprocessed region OP1 and the third trench LT3. The common wall CW is between the first unprocessed region OP1 and the fifth trench LT5, and also between the second unprocessed region OP2 and the fifth trench LT5. Likewise, in the block BK1, the staircase regions ST are between the first unprocessed region OP1 and the third trench LT3. The common wall CW is between the first unprocessed region OP1 and the first trench LT1, and also between the second unprocessed region OP2 and the first trench LT1 As shown in FIGS. 1-2, in each of the blocks BK1 and BK2, the staircase region ST is adjacent to a first side S1 or S2 of the unprocessed region OP, the common wall CW is adjacent to a second side S2 or S1 of the unprocessed region OP, the first side S1 or S2 is opposite to the second side S2 or S1. For example, in the block BK2, the staircase region ST is adjacent to a first side (e.g. S1) of the unprocessed region OP (e.g. first unprocessed region OP1), the common wall CW is adjacent to a second side (e.g. S2) of the unprocessed region OP (e.g. first unprocessed region OP1), the first side (e.g. S1) is opposite to the second side (e.g. S2). In the block BK1, the staircase region ST is adjacent to a first side (e.g. S2) of the unprocessed region OP (e.g. first unprocessed region OP1), the common wall CW is adjacent to a second side (e.g. S1) of the unprocessed region OP (e.g. first unprocessed region OP1), the first side (e.g. S2) is opposite to the second side (e.g. S1).

FIG. 3 shows a partial perspective view illustrating the block BK2 of the memory device 10 according to an embodiment of the present invention. As shown in FIGS. 1 and 3, the conductive layers 124 disposed in the middle portion of the stacked structure T1 (i.e. acting as word lines) continuously extend in the staircase region ST, a top landing region SSLR (detailed below), the first array region HP1, the common wall CW, and the second array region HP2. Since the second trench LT2 and the fourth trench LT4 are not connected to the isolating sidewall OW of the first unprocessed region OP1 and second unprocessed region OP2, each of the conductive layers 124 acting as the word line at the same layer in the same block (the block BK1 or the block BK2) is an integral structure in the staircase region ST, the first array region HP, the top landing region SSLR (detailed below), the common wall CW and the second array region HP2. Hence, the conductive layers 124 acting as word lines at the same layer in the first array region HP1 and the second array region HP2 can be electrically connected to each other. For example, as shown in FIG. 1 in the block BK2, the conductive layers 124 acting as word lines at the same layer disposed in the sub-blocks BK21 to BK24 on opposite sides of the fourth trench LT4 are an integral structure in the staircase region ST, the top landing region SSLR (detailed below), the first array region HP1, the common wall CW, and the second array region HP2 . . . . Compared with the comparative example without a common wall, the present application has the arrangement in which the same layer of word lines in the first array region HP1 and the second array region HP2 are electrically connected through the common wall CW, the volume occupied by the staircase region ST can be reduced.

Referring to FIGS. 2 and 7 at the same time, in each block (BK1 or BK2), the bottom isolating members GSLC extend along the first direction DI to separate the corresponding conductive layers 124 disposed in the bottom portion of the stacked structure T1, and define ground selection lines. The bottom isolating members GSLC contact the isolating sidewall OW of the first unprocessed region OP1 and second unprocessed region OP2. Each bottom isolating member GSLC includes an insulating material (e.g., oxide) to isolate the conductive layers 124 on opposite side of each bottom isolating member GSLC disposed in the bottom portion of the stacked structure T1.

As illustrated in FIG. 2 of the present embodiment, the unprocessed regions OP may include a first unprocessed region OP1 and a second unprocessed region OP2 in each of the blocks BK1 and BK2. The area of the first unprocessed region OP1 may be larger than the area of the second unprocessed region OP2 in the top view as shown in FIGS.

1-2. The first unprocessed regions OP1 and the second unprocessed regions OP2 can be separated by a portion of the second trench LT2 and a portion of the fourth trench LT4 in blocks BK1 and BK2, respectively. In the block BK1, a portion of the second trench LT2 and the bottom landing region GSLR may be disposed between the first unprocessed region OP1 and the second unprocessed region OP2. In the block BK2, a portion of the fourth trench LT4 and the bottom landing region GSLR may be disposed between the first unprocessed region OP1 and the second unprocessed region OP2. The conductive layers 124 at a bottom portion of the stacked structure T1 are exposed in the bottom landing region GSLR. In detail, in addition to extending along the first direction DI, the isolating sidewall OW also extends along the second direction DII and the third direction DIII. After the isolating sidewall OW surrounds the first unprocessed region OP1, the isolating sidewall OW continuously extends from the first unprocessed region OP1 to the second unprocessed region OP2 along the second direction DII and surrounds the second unprocessed region OP2 to form two closed spaces. In the blocks BK1 and BK2, the bottom isolating members GSLC adjacent to the first array region HP1 and the second array region HP2 contact the isolating sidewalls OW of the first unprocessed region OP1 and the second unprocessed region OP2, respectively as shown in FIGS. 1 to 2, but the present invention is not limited thereto. In other embodiments, the isolation sidewall OW can only form a closed space at the position of the first unprocessed region OP1, and an open space is formed at the position of the second unprocessed region OP2. For example, in block BK2, the isolating sidewall OW may extend along the lower and right sides of the second unprocessed region OP2 and connects to the bottom isolating member GSLC adjacent to the second array region HP2. But, the isolating sidewall OW does not extend to the upper and left sides of the second unprocessed region OP2. In the present embodiment, the two enclosed spaces formed by the first unprocessed region OP1 and the second unprocessed region OP2 are rectangular, but the present invention is not limited thereto.

As shown in FIGS. 2 and 3, in order to allow each of the conductive layers 124 disposed in the middle portion of the stacked structure T1 be connected to the word line contact WLN, a plurality of stepped structures MI are formed. The stepped structure MI allows each of the word lines (the conductive layers 124) to expose a landing pad LR in the staircase region ST, to facilitate the connection to the corresponding word line contact WLN. The stepped structures MI in the present embodiment can be formed through a minimal incremental layer cost process (MILC process), the MILC process can be performed through algorithm calculation, using a minimum of photomask and etching steps to form the stepped structures MI. The formed stepped structures MI may have a stepped profile that does not gradually decrease or increase in a regular way. Compared with the stepped structure that gradually decreases or increases in the regular way, the stepped structure MI formed by the MILC process can produce a denser stepped structure. Since the common wall CW is not performed by the MILC process, the stepped structures MI and the common walls CW are separated from each other in the top view as shown in FIG. 2. That is, the stepped structure MI and the common wall CW do not overlap in a plane defined by the second direction DII and the third direction DIII.

Referring to FIGS. 2 and 3 at the same time, the circuit structures CT are disposed under the connection region CR, the first array region HP1 and the second array region HP2. The vertical contacts TAC pass through the unprocessed regions OP (OP1 and OP2), the bottom plate 120 (shown in FIG. 5) and the insulating material 112 (shown in FIG. 5) disposed under the bottom plate 120 along the first direction DI. As illustrated in FIG. 5, each vertical contact TAC penetrates the stack of alternating pairs of first insulating layer 122 and second insulating layer 125 in the unprocessed regions OP (OP1 and OP2), the bottom plate 120 and the underlying insulating material 112 and electrically connects to the corresponding circuit structure CT. As illustrated in FIG. 3, the corresponding circuit structure CT electrically connects to the corresponding conductive layer 124 through at least one vertical contact TAC. As illustrated in FIGS. 2 and 3, in the middle portion of the stacked structure T1, the conductive layers 124 extend from the first array region HP1 and the top landing region SSLR into the staircase region ST. In the staircase region ST, a plurality of landing pads LR of the corresponding conductive layers 124 are exposed. In the present embodiment, each of the conductive layers 124 acting as a word line can electrically contact the word line contact WLN through the exposed landing pad LR, and the word line contact WLN is electrically connected to the vertical contact TAC through the first conductive connection 132. The vertical contact TAC is electrically connected to the circuit contact 136 through the second conductive connection 134, and the circuit contact 136 is electrically connected to the corresponding circuit structure CT. In this way, the voltage from the circuit structure CT can be transferred to the corresponding conductive layer 124 acting as a word line via the circuit contact 136. A voltage, a current or a signal is further transferred from the conductive layer 124 in the first array region HP1 to the conductive layer 124 in the second array region HP2 at the same layer through the common wall CW.

Similarly, as shown in FIG. 3, each of the conductive layers 124 acting as a ground selection line can electrically contact the ground selection line contact GSLN. That is, the ground selection line contacts GSLN electrically connect the corresponding conductive layers 124 at the bottom portion of the stacked structure T1 in the bottom landing region GSLR (as shown in FIGS. 2 and 3). The ground selection line contact GSLN is electrically connected to the vertical contact TAC through the first conductive connection 132, the vertical contact TAC is electrically connected to the circuit contact 136 through the second conductive connection 134. The circuit contact 136 electrically contacts the corresponding circuit structure CT. Each of the conductive layers 124 acting as a string selection line can electrically contact a string selection line contact SSLN. The string selection line contact SSLN is electrically connected to the vertical contact TAC through the first conductive connection 132. The vertical contact TAC is electrically connected to the circuit contact 136 through the second conductive connection 134. The circuit contact 136 is electrically connected to the corresponding circuit structure CT. The extending directions of the string selection line contact SSLN, the ground selection line contact GSLN and the circuit contact 136 may be parallel to the extending direction of the vertical contact TAC, for example, all extend along the first direction DI. The first conductive connection member 132 and the second conductive connection member 134 may respectively extend on a plane formed by the second direction DII and the third direction DIII.

Referring to FIGS. 2 and 4 at the same time. The connection region CR in each of blocks may further include two top landing regions SSLR. The top landing regions SSLR are disposed in two edge regions on opposite sides of the connection region CR. The two edge regions on both sides are respectively adjacent to the first array region HP1 and the second array region HP2. The top landing regions SSLR may be disposed between the first unprocessed region OP1 and the first array region HP1, and between the second unprocessed region OP2 and the second array region HP2, respectively. The string selection line contacts SSLN are disposed in the top landing regions SSLR. FIG. 4 is a cross-sectional view taken along the line X1-X1' in the sub-block BK24 of FIG. 2. As shown in FIG. 4, after a preliminary etching process is performed to form a preliminary stepped profile, the conductive layers 124 acting as the string selection lines in the first array region HP1 and the second array region HP2 are separated from each other. Hence, it is necessary to have the string selection line contact SSLN and the lateral connector 126 to enable the conductive layers 124 acting as the string selection lines at the same layer in the first array region HP1 and the second array region HP2 to be electrically connected to each other. The string selection line contacts SSLN shown in FIG. 4 are electrically connected to the conductive layers 124 acting as the string selection lines in the sub-block BK24 (as shown in FIG. 1). In the present embodiment, four string selection line contacts SSLN are exemplarily shown, and the lateral connectors 126 includes four lateral connectors 1261 to 1264, but the present invention is not limited thereto. In some embodiments, the lateral connectors 1261 to 1264 can be disposed on the same plane and are separated in the second direction DII and the third direction DIII, as long as the lateral connectors 1261 to 1264 can be electrically connected to the string selection lines contacts SSLN and the conductive layers 124 at the same layer, respectively. An upper surface of the string selection line contact SSLN and an upper surface of the ground selection line contact GSLN may have a same height, as shown in FIG. 6. The cross-sectional view of FIG. 4 corresponds to the cross-section of a portion of the common wall CW. It can be seen that the common wall CW includes a plurality of conductive layers 124 and a plurality of insulating layers 122 alternately stacked on the upper surface of the bottom plate 120 along the first direction DI. The conductive layers 124 disposed in a middle portion of the stacked structure T1 (i.e. acting as word lines) in the common wall CW extend continuously from the first array region HP1 to the second array region HP2.

FIG. 5 shows a cross-sectional view taken along the line X2-X2' in the sub-block BK22 of FIG. 2. Referring to FIGS. 2 and 5 at the same time, in the unprocessed regions OP (OP1 and OP2) (that is, in the closed spaces formed by the isolating sidewall OW), a plurality of first insulating layers 122 and a plurality of second insulating layers 125 are alternately stacked on the upper surface of the bottom plate 120 along the first direction DI. During the gate replacement process, since the unprocessed regions OP (OP1 and OP2) are protected by the isolating sidewall OW, the areas within the closed unprocessed regions OP (OP1 and OP2) will not be attacked by the etchant. Therefore, the second insulating layers 125 in the unprocessed regions OP (OP1 and OP2) will not be replaced with the conductive layers 124. On the contrary, the second insulating layers 125 outside the unprocessed regions OP (OP1 and OP2) not surrounded by the isolating sidewall OW will be replaced with the conductive layers 124. The vertical contacts TAC pass through the first insulating layers 122, the second insulating layers 125, the bottom plate 120, and the insulating material 112 covering the circuit structure CT along the first direction DI in the unprocessed regions OP (OP1 and OP2), to be electrically connected to the corresponding circuit structures CT. The vertical contacts TAC do not directly contact the bottom plate 120, and the vertical contacts TAC and the bottom plate 120 can be separated by the insulating material 112. In the present embodiment, the vertical contacts TAC may be provided in the first unprocessed region OP1 and the second unprocessed region OP2, but the present invention is not limited thereto, the vertical contacts TAC may only be disposed in the first unprocessed region OP1, but not be disposed in the second unprocessed region OP2. As shown in FIG. 1, a bottom landing region GSLR can be disposed between the first unprocessed region OP1 and the second unprocessed region OP2, the ground selection line contacts GSLN can be disposed in the bottom landing region GSLR. The ground selection line contacts GSLN and the bottom landing region GSLR can be electrically connected to the corresponding conductive layers 124 (i.e. the ground selection lines) disposed in the bottom portion of the stacked structure T1. Referring to FIGS. 1, 2 and 5 at the same time, the bottom landing region GSLR can overlap the stepped structure MI. The conductive layers 124 disposed in the bottom portion of the stacked structure T1 (that is, acting as ground selection lines) are exposed in the bottom landing region GSLR by the formation of the stepped structure MI. Each of the conductive layers 124 acting as the ground selection line can electrically contact the ground selection line contact GSLN. The ground selection line contacts GSLN shown in FIG. 5 are electrically connected to the conductive layers 124 acting as the ground selection lines in the sub-blocks BK21 to BK22 (as shown in FIG. 1). As shown in FIG. 5, the ground selection line contacts GSLN at the same layer can be electrically connected to each other through the lateral connectors 128. In the present embodiment, three pairs of ground selection line contacts GSLN are exemplarily shown, and the lateral connectors 128 include three lateral connectors 1281 to 1283, but the present invention is not limited thereto. In some embodiments, the lateral connectors 1281 to 1283 can be disposed on the same plane, and are separated in the second direction DII and the third direction DIII, as long as the lateral connectors 1281~1283 can be electrically connected to the ground selection line contacts GSLN and the conductive layers 124 at the same layer. The string selection line contacts SSLN shown in FIG. 5 are electrically connected to the conductive layers 124 acting as the string selection lines in the sub-block BK22 (as shown in FIG. 1). In order to simplify the drawing, the lateral connectors 126 are omitted.

FIG. 6 shows a cross-sectional view taken along the line X3-X3' in the sub-block BK21 of FIG. 2. Referring to FIGS. 2 and 6 at the same time, the word line contacts WLN are disposed in the staircase region ST. Since the staircase region ST can overlap the stepped structure MI, the conductive layers 124 in the middle portion of the stacked structure T1 (that is, acting as the word lines) are exposed in the staircase region ST by the formation of the stepped structure MI, that is, the landing pads LR are exposed, so that each layer of the conductive layers 124 acting as the word line can electrically contact the word line contact WLN. The string selection line contacts SSLN shown in FIG. 6 are electrically connected to the conductive layers 124 acting as the string selection lines in the sub-block BK21 (as shown in FIG. 1). The ground selection line contacts GSLN shown in FIG. 6 are electrically connected to the conductive layers 124 acting as the ground selection lines in the sub-blocks BK21 to BK22 (as shown in FIG. 1). In order to simplify the drawing, the lateral connectors 126 and 128 are omitted.

FIG. 7 shows a cross-sectional view taken along the line Y1-Y1' in FIG. 2. Referring to FIGS. 2 and 7 at the same time, the first trench LT1, the third trench LT3, and the fifth trench LT5 respectively pass through the stacked structure T1 along the first direction, and to the bottom plate 120. The first trench LT1, the third trench LT3, and the fifth trench LT5 respectively include a conductive strip LTI (e.g., tungsten) and an insulating sidewall LTO (e.g., oxide), as shown in FIG. 7. The insulating sidewalls LTO are disposed on the sidewalls of the first trench LT1, the third trench LT3, and the fifth trench LT5, the conductive strips LTI are disposed between the insulating sidewalls LTO and are in electrical contact with the bottom plate 120. In the present embodiment, the conductive strip LTI can be used as a source line, and the bottom plate 120 can be used as a common source line. In detail, before performing the gate replacement process, the trenches LT are formed first, and then the second insulating layers are removed through the trenches LT by the gate replacement process, and the conductive material is filled into the positions where the second insulating layers (125) are removed. Hence, a stacked structure T1 in which the conductive layers 124 and the first insulating layers 122 are alternately stacked is formed. After that, the trenches LT are slightly enlarged, and the insulating material and the conductive material are sequentially filled in the trenches LT to further form trenches LT including the conductive strips LTI and insulating sidewalls LTO. The first trench to the fifth trench LT1 to LT5 all have the same or similar structure in the cross-sectional view. Since the third trench LT3 has insulating sidewalls LTO, the third trench LT3 can electrically isolate the blocks BK1 and BK2 from each other.

As shown in FIG. 7, the bottom isolating members GSLC separate the bottommost three layers of the conductive layers 124 in the blocks BK1 and BK2, but the present invention is not limited thereto. In one example, the conductive layers 124 disposed in the bottom portion of the stacked structure T1 (acting as ground selection lines) are electrically isolated into two groups for each block (BK1 or BK2).

Referring to FIGS. 1, 2 and 8 at the same time, a length L1 formed by the stepped structure MI in the third direction DIII is greater than a length L2 formed by the staircase region ST in the third direction DIII. In FIG. 8, the word line contacts WLN disposed on opposite sides of the third trench LT3 are electrically connected to the conductive layers 124 acting as the word lines in the blocks BK1 and BK2, respectively.

Referring to FIGS. 1, 2 and 9 at the same time, the ground selection line contacts GSLN can include the ground selection line contacts GSLN1 to GSLN4, the ground selection line contacts GSLN1 to GSLN2 correspond to the block BK1, the ground selection line contacts GSLN3 to GSLN4 correspond to block BK2. Since the isolating sidewalls OW and the bottom isolating members GSLC separate the corresponding ones of conductive layers 124 acting as the ground selection lines, the ground selection line contacts GSLN1 to GSLN2 are respectively disposed on the first side S1 and the second side S2 of the isolating sidewall OW, and the ground selection line contacts GSLN3 to GSLN4 are respectively disposed on the first side S1 and the second side S2 of the isolating sidewall OW, the ground selection line contact GSLN1 is electrically connected to the conductive layer 124 acting as the ground selection line in the sub-block BK11 or BK12, and the ground selection line contact GSLN2 is electrically connected to the conductive layer 124 acting as the ground selection line in the sub-block BK13 or BK14, and the ground selection line contact GSLN3 is electrically connected to the conductive layer 124 acting as the ground selection line in the sub-block BK21 or BK22, and the ground selection line contact GSLN4 is electrically connected to the conductive layer 124 acting as the ground selection line in the sub-block BK23 or BK24.

Referring to FIGS. 1, 2 and 10 at the same time, the string selection line contacts SSLN may include string selection line contacts SSLN1 to SSLN8. Since the top isolating members SSLC separate the corresponding ones of the conductive layers 124 acting as the string selection lines, the string selection line contacts SSLN1 to SSLN8 are respectively disposed on the first side S1 and the second side S2 of the adjacent top isolating members SSLC. The string selection line contact SSLN1 is electrically connected to the conductive layer 124 acting as a string selection line in the sub-block BK11; the string selection line contact SSLN2 is electrically connected to the conductive layer 124 acting as the string selection line in the sub-block BK12; the string selection line contact SSLN3 is electrically connected to the conductive layer 124 acting as the string selection line in the sub-block BK13; the string selection line contact SSLN4 is electrically connected to the conductive layer 124 acting as the string selection line in the sub-block BK14; the string selection line contact SSLN5 is electrically connected to the conductive layer 124 acting as the string selection line in sub-block BK21; the string selection line contact SSLN6 is electrically connected to the conductive layer 124 acting as the string selection line in the sub-block BK22; the string selection line contact SSLN7 is electrically connected to the conductive layer 124 acting as the string selection line in sub-block BK23; the string selection line contact SSLN8 is electrically connected to the conductive layer 124 acting as the string selection line in the sub-block BK24.

In an embodiment, the materials of the top isolating members SSLC, the bottom isolating members GSLC, and the isolating sidewall OW may respectively include dielectric materials; the material of the first insulating layer 122 may include oxide; the material of the second insulating layer 125 may include nitride, such as silicon nitride; the material of the conductive layers 124 may include tungsten; the material of the insulating sidewall LTO may include a dielectric material, and the dielectric material may be an oxide, but the present invention is not limited thereto.

Based on the above, a memory device is provided according to an embodiment of the present application. The memory device includes a stacked structure, a circuit structure, and a vertical contact. The stacked structure includes a plurality of conductive layers and a plurality of first insulating layers alternately stacked along a first direction, and includes a first array region, a second array region, and a connection region. The first array region includes a plurality of first channel pillars extending along the first direction. The second array region includes a plurality of second channel pillars extending along the first direction. The connection region is disposed between the first array region and the second array region. The connection region includes a staircase region, an unprocessed region, a bottom isolating member and a common wall. The unprocessed region extends along the first direction and has an isolating sidewall. The isolating sidewall electrically isolates the conductive layers from the unprocessed region. The staircase region is in contact with a first side of the unprocessed region, and the common wall is in contact with a second side of the unprocessed region. The first side is opposite to the second side, and a portion of the conductive layers continuously extend in the staircase region, the first array region, the common wall, and the second array region, respectively. The bottom isolating member extends along the first direction to separate the conductive layers disposed in a bottom portion of the stacked structure and defines ground selection lines, and the bottom isolating member is in contact with the isolating sidewall. The circuit structure is disposed under the connection region and is exposed by the unprocessed region. The vertical contact passes through the unprocessed region and electrically connects the circuit structure to the corresponding conductive layer.

Compared with the comparative example in which the connection region in one block is only disposed on a single side of the array region, since the connection region of the present application is disposed between the first array region and the second array region, the distance for the transmission path of the current/voltage can be shortened, so that the resistance and capacitance can be reduced, thereby increasing the operating speed of the memory device. In addition, the arrangement that the word lines at the same layer in the first array region and the second array region are electrically connected through the common wall can reduce the volume occupied by the staircase region.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:

a stacked structure, comprising;

a plurality of conductive layers and a plurality of first insulating layers alternately stacked along a first direction;

a first array region comprising a plurality of first channel pillars extending along the first direction;

a second array region comprising a plurality of second channel pillars extending along the first direction; and a connection region disposed between the first array region and the second array region, wherein the connection region comprises a staircase region, an unprocessed region, a top isolating member, and a common wall, wherein the unprocessed region extends along the first direction, the staircase region is adjacent to a first side of the unprocessed region, the common wall is adjacent to a second side of the unprocessed region, the first side is opposite to the second side, and a portion of the conductive layers extends continuously in the staircase region, the first array region, the common wall and the second array region, and wherein the top isolating member extends along the first direction to separate the plurality of conductive layers disposed in a top portion of the stacked structure;

a circuit structure disposed under the connection region; and a vertical contact passing through the unprocessed region and electrically connecting the circuit structure disposed under the connection region.

2. The memory device according to claim 1, wherein the unprocessed region comprises a stack of alternating pairs of first insulating layer and second insulating layer.

3. The memory device according to claim 1, wherein the unprocessed region comprises at least one insulating material.

4. The memory device according to claim 1, further comprising at least one trench, wherein the at least one trench passes through the stacked structure along the first direction and extends along a second direction perpendicular to the first direction, and divides the stacked structure into two blocks.

5. The memory device according to claim 4, wherein the at least one trench comprises a conductive strip and an insulating sidewall.

6. The memory device according to claim 1, wherein the top isolating member separates each of the plurality of conductive layers disposed in the top portion of the stacked structure into two string selection lines.

7. A memory device, comprising:

a stacked structure, comprising;

a plurality of conductive layers and a plurality of first insulating layers alternately stacked along a first direction;

a first array region comprising a plurality of first channel pillars extending along the first direction;

a second array region comprising a plurality of second channel pillars extending along the first direction;

a connection region disposed between the first array region and the second array region, wherein the connection region comprises a staircase region, an unprocessed region, a top isolating member, and a common wall, wherein the unprocessed region extends along the first direction and is adjacent to the common wall, and the unprocessed region electrically isolates from the plurality of conductive layers, wherein the top isolating member extends along the first direction to separate the plurality of conductive layers disposed in a top portion of the stacked structure, wherein the common wall includes the plurality of conductive layers extending continuously from the first array region to the second array region;

at least two trenches extending and passing through the stacked structure along the first direction, and extending along a second direction perpendicular to the first direction; and a vertical contact passing through the unprocessed region and electrically connecting a circuit structure disposed under the connection region.

8. The memory device according to claim 7, wherein the unprocessed region comprises a stack of alternating pairs of first insulating layer and second insulating layer.

9. The memory device according to claim 7, wherein the unprocessed region comprises at least one insulating material.

10. The memory device according to claim 7, wherein each of the at least two trenches comprises a conductive strip and an insulating sidewall.

11. The memory device according to claim 7, wherein the top isolating member separates the conductive layers disposed in the top portion of the stacked structure into two string selection lines.

* * * * *